(12) United States Patent
Lu et al.

(10) Patent No.: US 7,186,471 B2
(45) Date of Patent: *Mar. 6, 2007

(54) CHEMICALLY ORDERED, COBALT-THREE PLATINUM ALLOYS FOR MAGNETIC RECORDING

(75) Inventors: Bin Lu, Franklin Park, PA (US); Dieter Weller, Gibsonia, PA (US)

(73) Assignee: Seagate Technology LLC, Scotts Valley, CA (US)

(*) Notice: Subject to any disclaimer, the term of this patent is extended or adjusted under 35 U.S.C. 154(b) by 201 days.

This patent is subject to a terminal disclaimer.

(21) Appl. No.: 10/374,641

(22) Filed: Feb. 26, 2003

(65) Prior Publication Data

US 2003/0162055 A1 Aug. 28, 2003

Related U.S. Application Data

(60) Provisional application No. 60/360,341, filed on Feb. 28, 2002.

(51) Int. Cl.
*G11B 5/66* (2006.01)
*G11B 5/70* (2006.01)

(52) U.S. Cl. ................................. 428/836.1
(58) Field of Classification Search ............ 428/694 T, 428/900, 836.1, 836.2
See application file for complete search history.

(56) References Cited

U.S. PATENT DOCUMENTS 3,961,946 A * 6/1976 Makino et al. ............. 420/468

| | | |
|---|---|---|
| 4,814,053 A | 3/1989 | Shimokawato ......... 204/192.15 |
| 5,478,661 A | 12/1995 | Murayama et al. ...... 428/694 T |
| 5,658,659 A | 8/1997 | Chen et al. ................. 428/332 |
| 5,736,013 A | 4/1998 | Ranjan et al. ............ 204/192.2 |
| 5,922,456 A | 7/1999 | Tanahashi et al. .......... 428/332 |
| 6,086,974 A * | 7/2000 | Thiele et al. ............. 428/832.1 |
| 6,174,597 B1 | 1/2001 | Yusu et al. |

(Continued)

FOREIGN PATENT DOCUMENTS

DE 4021970 1/1991

(Continued)

OTHER PUBLICATIONS

The Feasibility of Magnetic Recording at 1 Terabit per Square Inch; IEEE Transactions on Magnetics, vol. 36, No. 1, Jan. 2000.

(Continued)

*Primary Examiner*—Holly Rickman
(74) *Attorney, Agent, or Firm*—Patterson & Sheridan, LLP; Carol Bordas-Loutzenhiser

(57) ABSTRACT

A magnetic recording layer having polycrystalline chemical ordered $(CoX)_3Pt$ or $(CoX)_3PtY$ alloys. The additive X comprises Sc, Ti, V, Cr, Mn, Ni, Cu, Zn, Ga, Ge, Nb, Mo, Ru, Rh, Pd, Ag, Cd, In, Sn, Hf, Ta, W, Re, Os, B, or C, or any combination thereof. The additive Y comprises B, MgO, $Al_2O_3$, $SiO_2$, P, CaO, CoO, $B_2O_3$, ZnO, NbO, $Mo_2O_3$, $Co_2O_3$, C, Cr, P, $TiO_2$, $Cr_2O_3$, MnO, $ZrO_2$, or BaO. The ratio of (CoX) to Pt is 2.33 to 4.00, plus or minus 5%. The additive Y may range from approximately 0 to 20% of the entire composition. The magnetic layer may be a constituent layer in a hard disc drive magnetic recording medium.

11 Claims, 8 Drawing Sheets

U.S. PATENT DOCUMENTS

| | | |
|---|---|---|
| 6,228,515 B1 | 5/2001 | Shin et al. |
| 2001/0000445 A1 | 4/2001 | Shiroishi .................... 360/317 |
| 2002/0001736 A1 | 1/2002 | Akimoto et al. ......... 428/694 T |

FOREIGN PATENT DOCUMENTS

JP          8-306004 A2 * 11/1996

OTHER PUBLICATIONS

Thermal Decay Estimation of Perpendicular Magnetic Recording; Journal of Magnetism and Magnetic Materials 235 (2001) 25-29; 2001 Elsevier Science B.V.

Low Noise Performance of CoCrPt Single-Layer Perpendicular Magnetic Recording Media; IEEE Transactions on Magnetics, vol. 36, No. 5, Sep. 2000.

Thermal Effect Limits in Ultrahigh-Density Magnetic Recording; IEEE Transactions on Magnetics, vol. 35, No. 6, Nov. 1999.

Physical Review Letters; vol. 71, No. 15, Oct. 11, 1993.

Large Magnetic Anisotropy in $Co_3Pt$ Ordered Phase Thin Films; Mat. Res. Soc. Symp. Proc. vol. 517; 1998 Materials Research Society.

Recording Technologies for Terabit per Square Inch Systems; Roger wood, Terry Olson, Jim Miles; Dept. of Computer Science, Manchester University, England.

The Origin of the Large Perpendicular Magnetic Anisotropy in $Co_3Pt$ Alloy Thin Films; Journal of Applied Physics, vol. 85, No. 8; Apr. 15, 1999.

High $K_u$ Materials Approach to 100 Gbits/$in^2$ ; IEEE Transactions on Magnetics, vol. 36, No. 1, Jan. 2000.

Magneto-optical Kerr Spectroscopy of Transition Metal Alloy and Compound Films; Lecture Notes in Physics; Spin—Orbit-Influenced Spectroscopies of Magnetic Solids; Springer; D. Weller; IBM Almaden Research Center, 650 Harry Road, San Jose, CA 95120.

Copy of International Search Report dated Jul. 14, 2003 from corresponding PCT application, PCT/US03/05916.

* cited by examiner

CHEMICALLY ORDERED, COBALT-THREE PLATINUM ALLOYS FOR MAGNETIC RECORDING

CROSS-REFERENCE TO RELATED APPLICATIONS

This application claims benefit of U.S. provisional patent application Ser. No. 60/360,341, filed on Feb. 28, 2002, which is hereby incorporated by reference.

BACKGROUND OF THE INVENTION

1. Field of the Invention

The present invention relates to thin films for perpendicular magnetic recording media, and more particularly related to cobalt alloy based magnetic layers.

2. Description of the Related Art

Hard disc drive areal recording density has rapidly increased ever since the industry began in the late '50s. As areal density continues to increase, the size of the magnetic domains comprising information or bits continues to decrease. As bit size continues to decrease, the ability of the media to maintain the magnetization of a bit decreases due to thermal effects that cause spontaneous de-magnetization of a bit. Thermal effects can be countered to some degree by a variety of techniques. However, even with the application of all known techniques, conventional longitudinal recording is quickly approaching a thermal limit. New approaches are needed.

Perpendicular media has greater thermal stability than longitudinal media (for similarly sized bits). See, "The feasibility of magnetic recording at 1 Terabit per square inch", R. Wood, IEEE Trans. Magn. 36, 36 (2000). For this reason, perpendicular recording on perpendicular media may soon replace longitudinal recording.

Perpendicular magnetic recording media typically consists of a multilayer structure. The first layer is a soft magnetic underlayer. This layer is formed over a rigid substrate and provides a flux return path or flux sink. The next layer is an interlayer that is used to control the grain size and crystals structure of the magnetic layer. A magnetic layer is then formed on interlayer. This layer will have its easy magnetization axis vertically oriented. This layer, in turn, is protected by an overcoat such as carbon. The carbon layer is typically lubricated with an organic lubricant.

The magnetic layer is the layer on which the information is stored and which must be thermally stable.

Perpendicular media must not only have high thermal stability, it must have a high signal to noise ratio ("SNR"). Low noise is achieved by minimizing grain volume V. Thermal stability is increased by increasing magnetic anisotropy ("$K_u$"). The magnetic anisotropy ($K_u$) of the media should be sufficiently high so that the total magnetic anisotropy energy per grain ($K_u V$) is large enough to overcome the thermal fluctuation effect ($\sim k_B T$) in a rigid-disk drive environment. Thus, noise and stability are trade-offs.

Hcp-structured Co-alloys, employed in conventional longitudinal recording media, have low magnetic anisotropy. For this reason they do not meet the thermal stability requirement for very high-density recording. $Co_3Pt$-alloys, L10-phased materials (e.g. FePd, FePt, CoPt, MnAl) and rare-earth-transition-metals (e.g. $Fe_{14}Nd_2B$, $SmCo_5$) are examples of alloys that do have sufficiently high $K_u$ and therefore possible candidates for high-density, perpendicular, magnetic recording media.

$Co_3Pt$ phase alloys can exhibit a large magnetic anisotropy ($K_u > 2 \times 10^7$ erg/cc) when epitaxially grown onto single crystal substrates. The intrinsic anisotropy is associated with the chemically ordered phase of $Co_3Pt$. The chemically ordered phase is not found in the equilibrium hcp Co—Pt phase. Nevertheless, a fully ordered $Co_3Pt$ film can reach an anisotropy as high as $\sim 3.1 \times 10^7$ erg/cc. These properties, together with an intrinsic magnetization of the pure $Co_3Pt$ phase of 1100 emu/cm$^3$ indicate that these chemically ordered Co-alloys possess the required anisotropy and magnetization necessary for thermal stability in a tera-bit-per-square-inch magnetic recording regime.

In order to record discrete information on isolated bits, thin magnetic recording films cannot be single crystals. They must be polycrystalline, that is, be composed of separated, individual crystals also known as grains. The crystals must have their magnetic easy axis oriented perpendicular to the film plane for perpendicular recording. To reduce noise and increase thermal stability, the orientation dispersion around the film normal should also be as small as possible and the grain size distribution should be as narrow as possible. Moreover, the grain boundaries should be sufficiently wide to magnetically isolate the neighboring grains. The grain boundaries may consist of voids or non-magnetic materials.

This type of microstructure is normally obtained in the manufacture of conventional hcp Co-alloys by controlling the deposition process, modifying the interlayers and by choosing a suitable magnetic alloy composition. Compared with the high $K_u$ materials discussed above, including chemically ordered $Co_3Pt$, conventional hcp Co-alloys have many advantages that permit one to obtain the right equilibrium phase and to control the desirable microstructure features, i.e., orientation, grain size and its distribution, chemical segregation, composition, etc.

However, all prior chemically ordered $Co_3Pt$ films have been single-crystal films. There is no known process for making a chemically ordered $Co_3Pt$ film with all the microstructural properties described above.

Another problem presented by $Co_3Pt$ is that its saturation magnetization ("$M_s$") of 1100 emu/cm$^3$ is too high for conventional hard disc recording. High $M_s$ gives rise to a signal that is out of dynamic range of today's reader-heads. Too much signal causes the reader to saturate.

There is a need for a chemically ordered polycrystalline thin film of $Co_3Pt$ for use in a perpendicular magnetic recording medium.

SUMMARY OF THE INVENTION

The invention comprises a polycrystalline $Co_3Pt$-phased magnetic recording layer. In one embodiment, polycrystalline alloy has the general formula $(CoX)_zPt$, where z ranges from 2.33 to 4.00, and where X is one or more additive elements that help to form the bulk film into refined grains and to chemically segregate one grain from adjacent grains. X is selected from a group consisting of Sc, Ti, V, Cr, Mn, Ni, Cu, Zn, Ga, Ge, Nb, Mo, Ru, Rh, Pd, Ag, Cd, In, Sn, Hf, Ta, W, Re, Os, B, C, or any combination thereof.

In a second embodiment, the magnetic layer is composed of $Co_zPt+Y$ or $(CoX)_zPt+Y$, where z ranges from 2.33 to 4.00, X is same as in connection with $(CoX)_zPt$, and Y is a non magnetic material selected from the group consisting of B, MgO, $Al_2O_3$, $SiO_2$, P, CaO, CoO, $B_2O_3$, ZnO, NbO, $Mo_2O_3$, $Co_2O_3$, C, Cr, P, $TiO_2$, $Cr_2O_3$, MnO, $ZrO_2$, or BaO. The additive Y exists at the grain boundaries of the $Co_zPt$ or $(CoX)_zPt$ grains or forms a surrounding matrix to effectively decouple the magnetic grains from each other. The additive Y may range from approximately zero percentage to approximately 20% of the entire composition.

Hereinafter, $Co_3Pt$ will generally refer to $Co_zPt$ or $(CoX)_zPt$ where z has the range above specified.

In a preferred embodiment, the CoX portion of the alloy has the formula $$Co_{100-x}Cr_{x-y}X_y$$

where x and y are atom % of the sub-composition, and where $0 \leq x \leq 35$ and $0 \leq y \leq 5$.

Magnetic recording media formed from the novel alloy has a rigid substrate and one or more interlayers that have an hap structure deposited with their c-axis perpendicular to the film plane. The $Co_3Pt$-alloy layer is grown epitaxially on top of the interlayer.

DETAILED DESCRIPTION OF THE PREFERRED EMBODIMENTS

Figure 1:
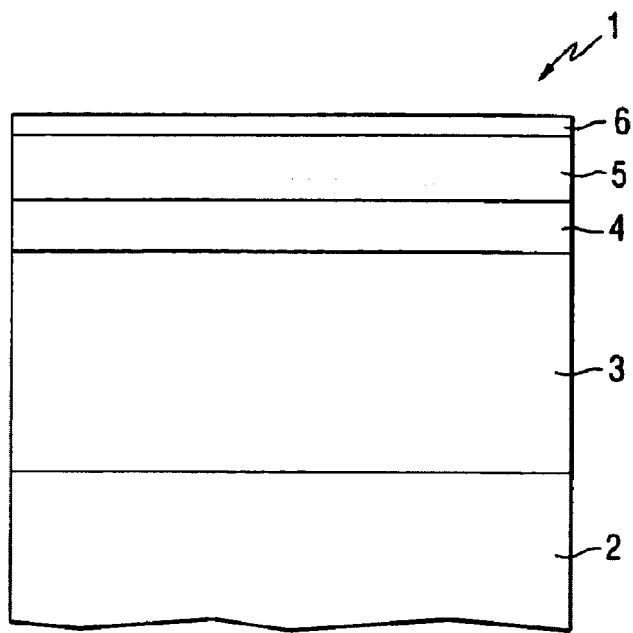
FIG. 1 is schematic of a multilayer perpendicular magnetic recording medium.

FIG. 1 is schematic of a multilayer perpendicular magnetic recording medium 1. The recording medium 1 is comprised of a substrate 2, a soft magnetic underlayer 3, a non-magnetic interlayer 4, a top Co-alloy layer 5, and a carbon overcoat 6. In an alternative arrangement, the soft underlayer 3 can be removed. The top layer 6 is typically lubricated using an organic lubricant such as Z-dol.

The substrate 2 can be Ni—P coated aluminum, polished glass or a ceramic.

The soft magnetic underlayer 3 may be FeCoB. This underlayer 3 provides a magnetic flux sink or return path to provide magnetic flux coupling through the vertically oriented easy axis. The soft magnetic underlayer layer 3 is sputtered-deposited on the substrate to a thickness of 200 nm.

Interlayer 4 can be a single layer or multiple layers and may be composed of one or more of the following:

$CoCr_{37}Ru_{10}\backslash Ru$, $Ta\backslash Ru$, $Ta\backslash CoCr_{37}Ru_{10}\backslash Ru$, $Ru\backslash CoCrRu$, $CoCr_{35}\backslash CoCr_{25}Ru_{50}\backslash Ru$, $CoCr_{25}Ru_{50}\backslash Ru$, $Ru\backslash CoCr_{25}Ru_{50}\backslash Ru$, $Ru$—$ZrO_2\backslash CoCr_{25}Ru_{50}\backslash Ru$, $Ru$—$ZrO_2\backslash ITO\backslash CoCr_{25}Ru_{50}\backslash Ru$. Here ITO stands for a mixture of $In_2O_3$–10 wt % $SnO_2$. Each of these alloys is non magnetic.

Interlayer 4 is sputter-deposited on the soft magnetic layer to a thickness of between about 3 and 8 nm. The multiple alloys of an interlayer layer may be formed using the same process as will be described below to sputter the magnetic layer. The interlayers are preferably sputtered at an Ar pressure of about 10 mTorr with an energy level of about 200 Watts. This provides a deposition rate is about 1 nm/s.

Interlayer 4 controls the orientation of the magnetic layer, the epitaxial growth of the magnetic layer and the grain size of the magnetic layer. The interlayer causes the magnetic material, $Co_3Pt$ and alloys thereof, to form into small crystals when epitaxially grown on the interlayer grains.

A magnetic layer 5 is now sputter-deposited on the interlayer. Sputtering is preferentially conducted in Ar at a pressure of about 10 mTorr. The temperature of the target is controlled, as described below, to induce chemical ordering into the $Co_3Pt$ alloy.

Figure 2:
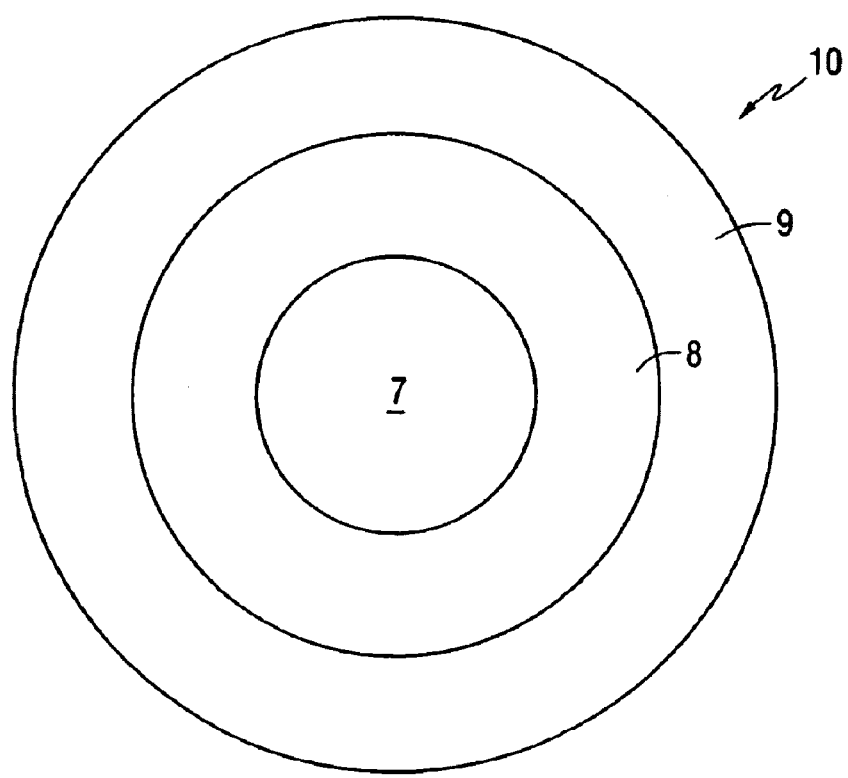
FIG. 2 is a plan view of a sputtering target having a plurality of concentric regions of varying compositions.

This multi-alloy layer is preferably sputtered from target 10 as illustrated in FIG. 2. The target 10 may have three concentric rings or regions of different materials. The center ring or region material 7 may, for example, be composed of the additive Y to form an alloy having the formula $$(CoX)_zPtY_m,$$

where 0<m<20 atomic percent of the composition. The additive Y is a non magnetic material selected from the group consisting of B, MgO, $Al_2O_3$, $SiO_2$, P, CaO, CoO, $B_2O_3$, ZnO, NbO, $Mo_2O_3$, $Co_2O_3$, C, Cr, P, $TiO_2$, $Cr_2O_3$, MnO, $ZrO_2$, BaO. The additive deposits and surrounds the $(CoCr)_zPt$ grains to effectively decouple the magnetic grains from magnetic exchange interaction with each other. The additive may range from very small percentages, such as one-half percent, to as high as 20% of the total alloy.

The intermediate ring 8 may be composed of platinum. The outer ring 9 may be composed of the cobalt-chromium alloy having the formula $$Co_{100-x}Cr_{x-y}X_y,$$

where x and y are atom % of the CoCrX sub-composition, and where $0 \leq x \leq 35$ and $0 \leq y \leq 5$, with y comprising the amount of the additive X. X is selected from a group consisting of Sc, Ti, V, Cr, Mn, Ni, Cu, Zn, Ga, Ge, Nb, Mo, Ru, Rh, Pd, Ag, Cd, In, Sn, Hf, Ta, W, Re, Os, B, C, or any combination thereof. The sputtering pressure may be, for example, 5 m Torr. The preferred sputtering rate is approximately 0.9 nm per second. The magnetic layer may be deposited to a thickness of approximately 12 nm.

In order to sputter different alloys from such a target, the amount of sputtering power may be varied according to the portion of the target being sputtered. This power differential affects the sputtering rate and therefore the deposition rate of the target material by target location.

For example, in order to sputter $(Co_{0.75}Cr_{0.25})_3Pt$, the outer ring 9 can be composed of $Co_{0.75}Cr_{0.25}$, the middle ring 8 of Pt, and the center ring 7 may be empty. The outer $Co_{0.75}Cr_{0.25}$ ring 9 may then be sputtered with a plasma having 209 watts RF power. The middle platinum ring 8 may be sputtered with plasma of 30 watts.

If the center ring 7 is employed, the sputtering RF power may range from as low as 5 watts to as high as 60 watts. The power density may change according to the material sputtered and the percentage of the material intended to be deposited. When this power density range is used to sputter Boron for example, with the other rings sputtered as described above, Boron will be deposit on the media so that it constitutes between approximately 1% to approximately 12% of the total composition. In one example, the power of outer ring ($CoCr_{25}$) is 209 W, Middle ring (Pt) is 30 W and the Inner disk is 20 W (Boron), this gives rise to a nominal composition of $[(CoCr_{25})_3Pt]_{98}B_2$, which can be expanded out as $Co_{55.1}Cr_{18.4}Pt_{24.5}B_2$.

These wattages are given when using a Unaxis Circulus-M12 (Unaxis-Deutschland. GmbH, Alzenau, Germany) sputtering system with a target having an overall diameter of 160 mm, an ID of 56 mm and an MD at 108 mm. The precise wattages depend on the sputter machine, conditions, target dimensions and materials.

In order to change the ratio of cobalt and chromium or cobalt, chromium and the additive X, their composition percentages are correspondingly changed in the outer ring 9 of the sputtering target 10.

Figure 3:
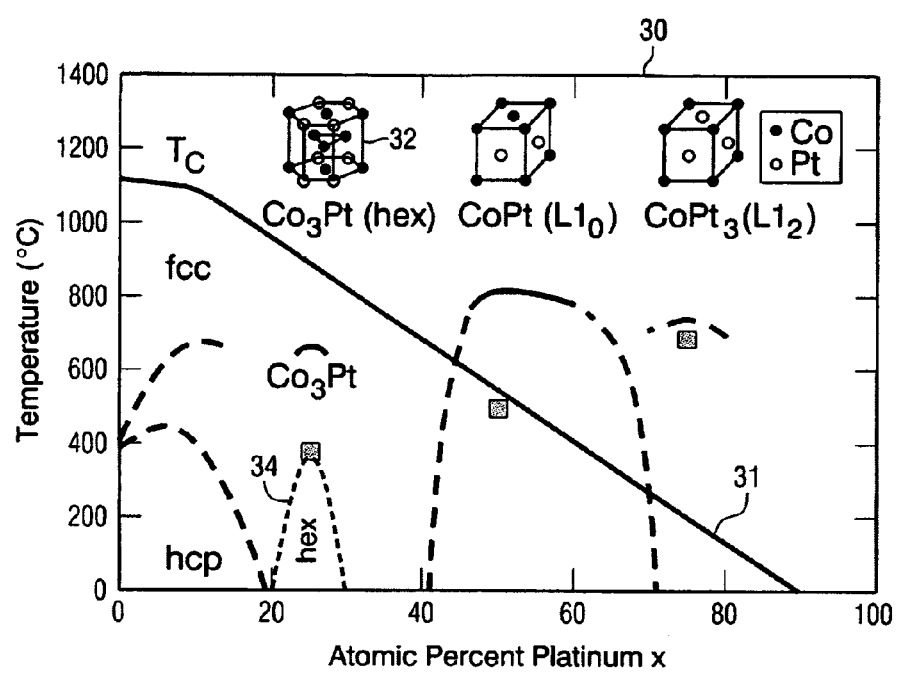
FIG. 3 is a bulk phase diagram of cobalt-platinum illustrating the $Co_3Pt$ metastable phases depending upon composition percentages and sputtering and/or annealing conditions.

FIG. 3 is a bulk phase diagram 30 taken from FIG. 10 of D. Weller, in "Spin-Orbital-influenced Spectroscopies of Magnetic Solids", Eds. H. Ebert, G. Schutz, Springer 1995. The solid line 31 presents the Curie temperature, $T_c$, vs. atomic percentage of platinum in the base CoPt alloy. The square dots illustrate the deposition or annealing temperatures that induce, for example, the chemically ordered structure of the $Co_3Pt$ phase into the $Co_3Pt$ alloy. The broken lines illustrate the range of alloy composition over which the particular $Co_3Pt$ phase may be formed. Above the various phases is a diagram that presents the respective phase's crystallographic structure.

In the figure, the chemically ordered phase occurs at 380° C. and a Co to Pt percentage of 75 to 25, respectively, plus or minus 5%. While the ordered phase occurs at 380° C., it also occurs at temperatures as low as 280° C. and the percentage that is ordered increases until it apparently reaches saturation at approximately 320° C. Some ordering has even been detected at 240° C. See the discussion below in connection with FIGS. 4a and 4b.

Figure 4A:
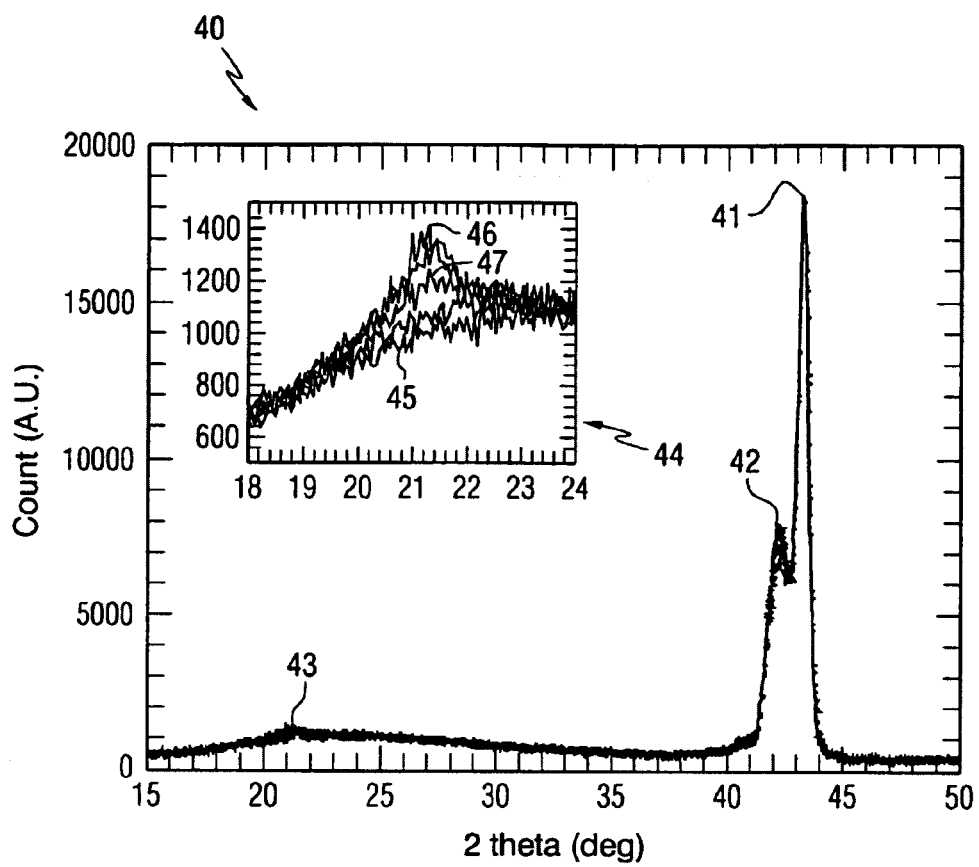
FIG. 4 illustrates a series of X-ray diffraction (XRD) 2theta-theta scan of the polycrystalline $(CoCr)_3Pt$ perpendicular thin films on Ru interlayers.

FIG. 4a is a chart 40 that shows a series of X-ray diffraction ("XRD") 2theta-theta scans of a number of $(CoCr)_3Pt$ perpendicular thin films on Ru interlayer. The media were processed under varies temperatures. The peak 41 at 43.1° is attributed to the 00.2 orientation of $(CoCr)_3Pt$. The peak 42 at 42.2° is attributed to 00.2 orientation of the Ru layer. A third peak 43 occurs at around 2θ=21.25°. This peak is attributed to the chemically ordered (00.1) phase of $(CoCr)_3Pt$. The small inserted plot 44 shows an enlargement of the interested region of the XRD scan. It shows the ordering peak intensity increasing as the process temperature is increased from 180° C. (45) to 300° C. (46). Some ordering occurs at intermediate peak 47, or 240° C.

Figure 4B:
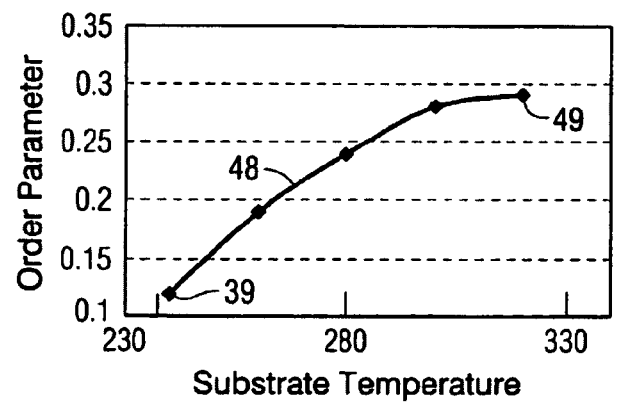

FIG. 4b is a chart of order parameter vs. substrate temperature in degrees centigrade, where order parameter is defined as the intensity ratio of the ordered peak (00.1) and the disordered peak (00.2) of the $Co_3Pt$ alloy. The data (48) shows some ordering at 240° C. (39). The chart indicates that the ordering effect reaches a plateau at 320° C. (49). The plateau continues to at least 380° C.

In general, it is better for magnetic recording to conduct the deposition of magnetic materials at the lowest temperature possible.

Figure 5B:
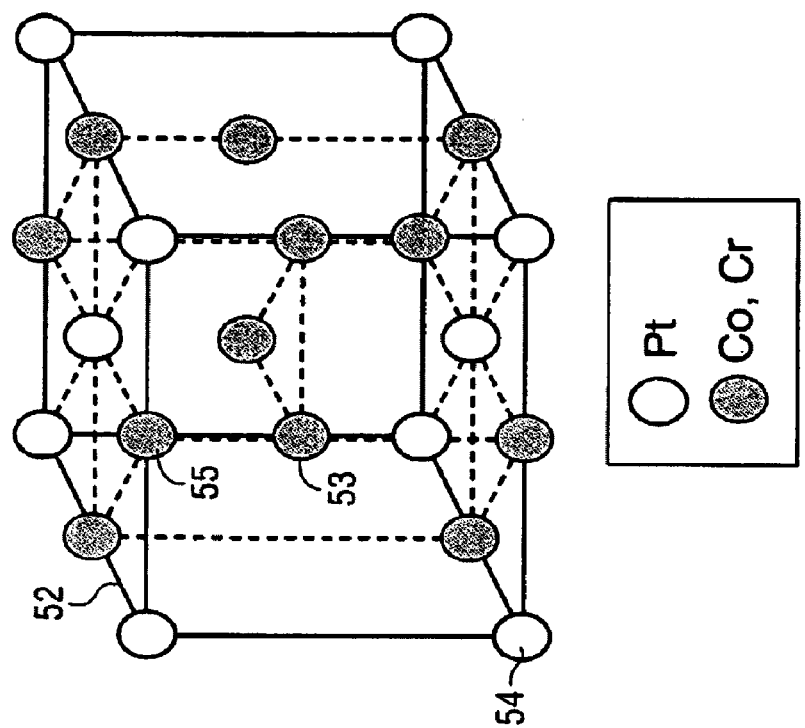
FIGS. 5a and 5b are a side-by-side comparison of disordered versus ordered cobalt-chromium-platinum alloy.
Figure 5A:
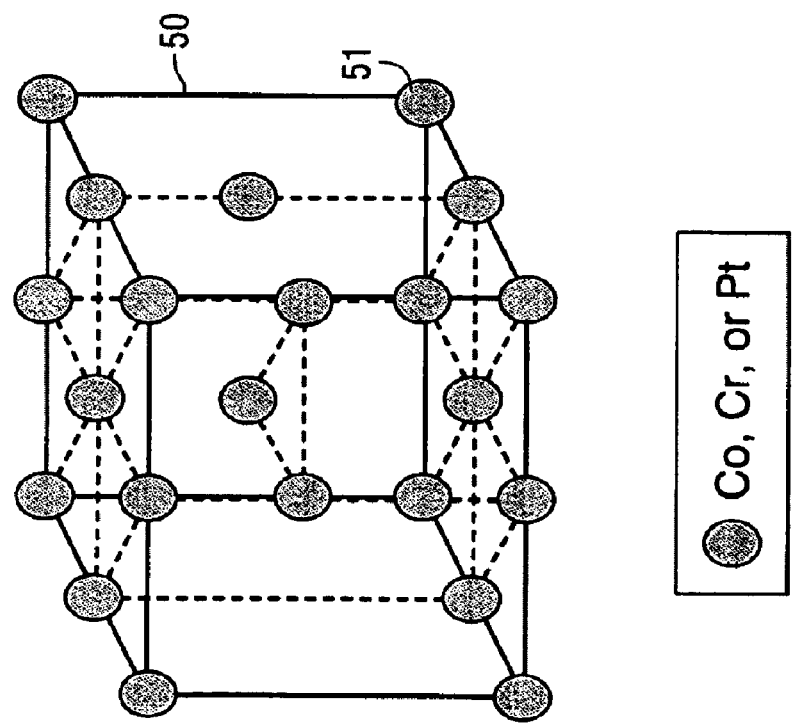

FIGS. 5a and 5b are a side-by-side comparison of disordered CoCrPt-hcp atomic structures 50 with a chemically ordered $(CoCr)_3Pt$-hcp alloy 52. In the disordered structure illustrated in FIG. 5a, the cobalt, chromium and platinum atoms are randomly placed in the crystal at each vertex 51.

In the ordered phase 52 illustrated in FIG. 5b, the cobalt, chromium and platinum atoms are ordered as shown in the figure, i.e. the platinum atoms 54 occupying the vertices denoted with the unshaded circles and the cobalt and chromium atoms 55 occupying the vertices denoted with the shaded circles. The chemically ordered phase (FIG. 5b) has an intermediate layer 53 entirely consisting of cobalt or chromium atoms. This generates the (00.1) diffraction peak 43 in the XRD scan. The ordered crystal has an ordered, hcp structure.

Figure 6:
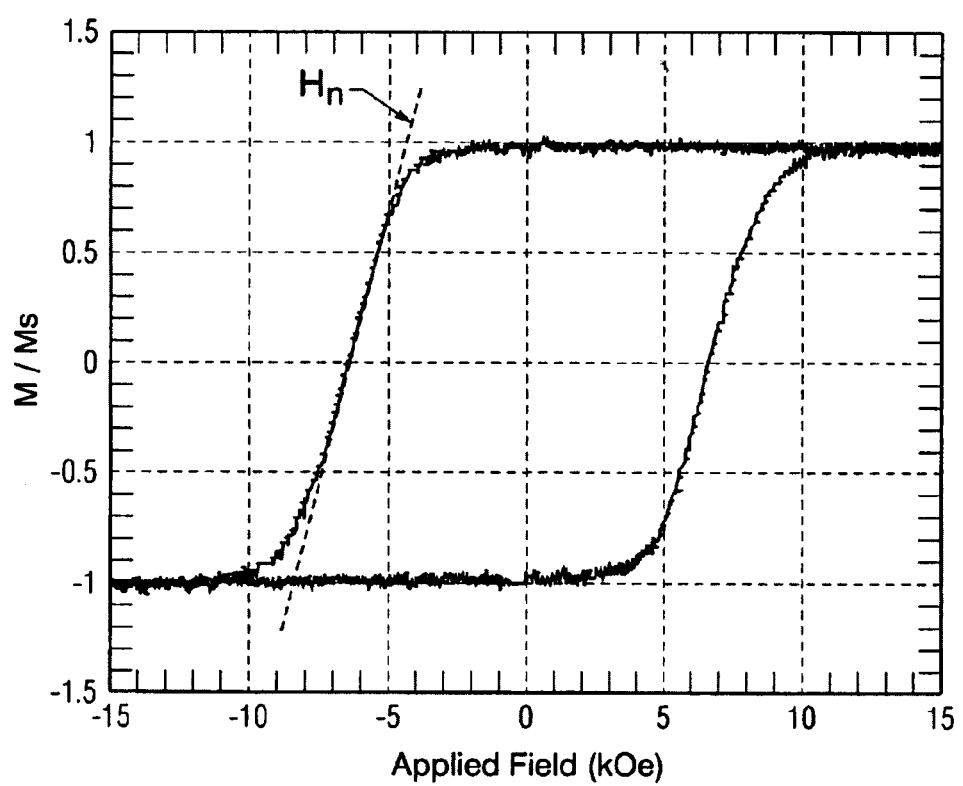
FIG. 6 is a chart showing a normalized MOKE hysteresis loop of chemically-ordered $(CoCr)_3Pt$ media.
Figure 7:
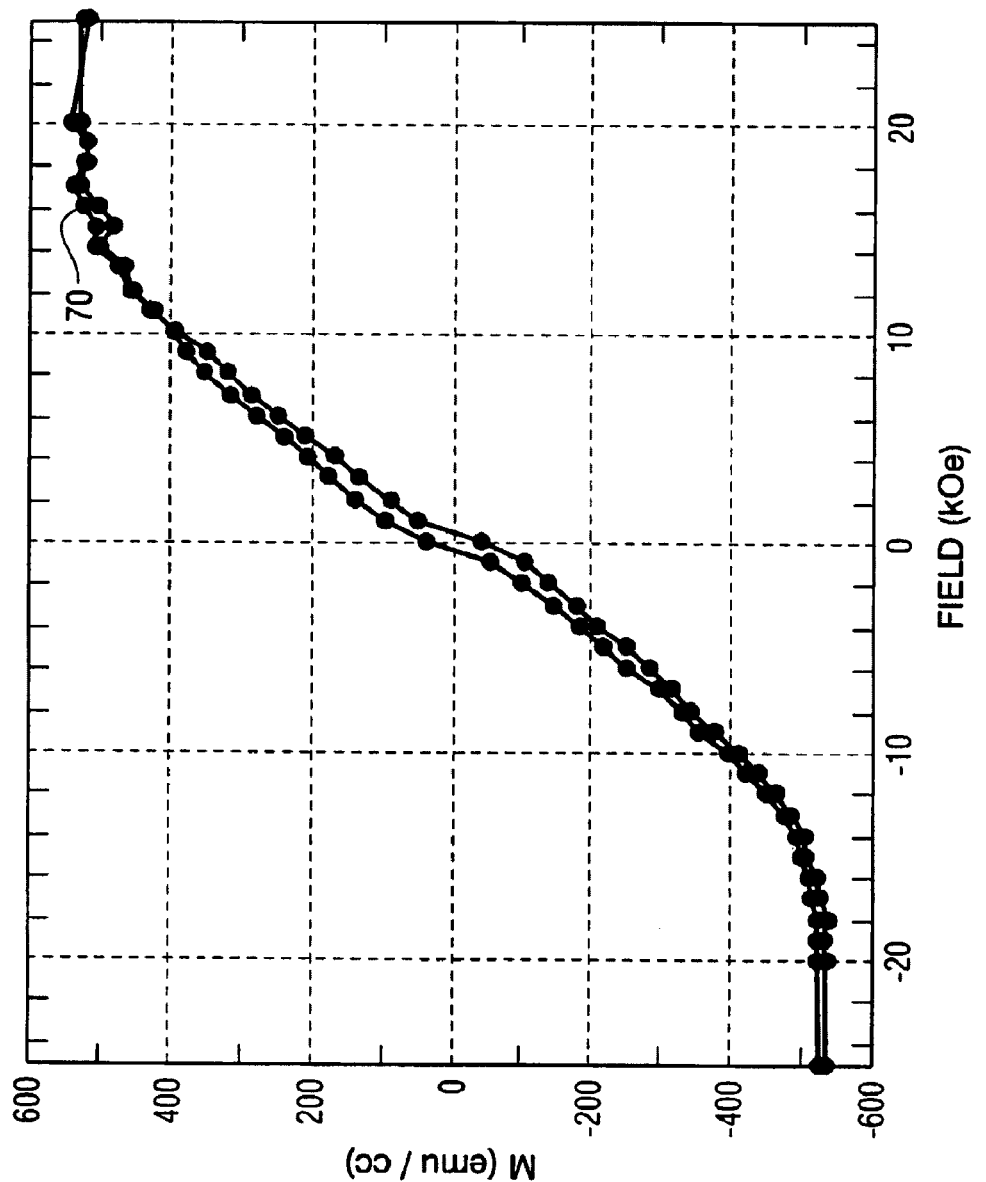
FIG. 7 is a chart of an in-plane hysteresis loop of chemically-ordered $(CoCr)_3Pt$ media measured using a SQUID magnetometer.

FIG. 6 is a normalized MOKE hysteresis loop of the $(CoCr)_3Pt$ media at thickness of 11.6 nm. The coercivity is $H_c$=6.52 kOe, squareness S=1, nucleation field $H_n$=4.5 kOe. $H_n$ is defined here as the intercept of the tangent to the M-H loop at the coercivity field and the $M/M_s$=1 line. This data shows that the $(CoCr)_3Pt$ media has a very hard perpendicular magnetic properties even at small thicknesses. It can easily fulfill the requirements for ultra-high density recording FIG. 7 is an in-plane hysteresis loop measured using a SQUID magnetometer. The effective anisotropy field including the demagnetization effect ("$H_{keff}$") is measured at the saturation 70 of the loop. Using this technique, $H_{keff}$=15 kOe. Using an estimation of $H_k=H_{keff}+4\pi M_s$ and $K_u=H_kM_s/2$, Hk=21.7 kOe and $K_u$=5.7×10$^6$ erg/cm3. $M_s$=530 emu/cm$^3$. This data demonstrates that the intrinsic magnetic properties are very hard. The media will have high thermal stability for a terra bit per square inch design.

Figure 8:
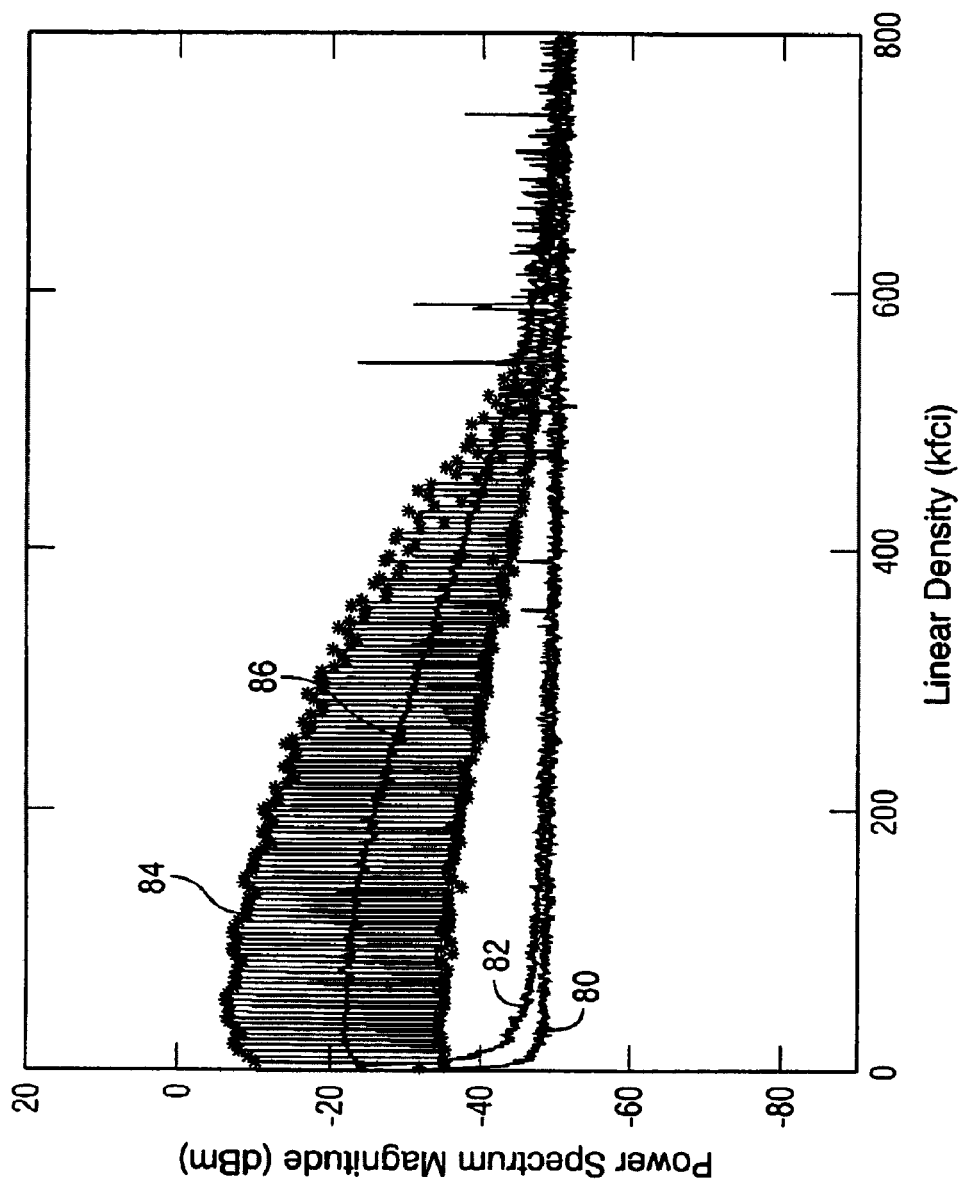
FIG. 8 is a chart illustrating the recording spectrum of chemically-ordered $(CoCr)_3Pt$ media.

FIG. 8 is a chart illustrating the spectral dependence of the readback signal of a pseudo-random-bit-sequence of a $(CoCr)_3Pt$ media of 11 nm thickness. The magnetic properties of the medium are: $H_c$=5.58 kOe, S=1, $H_n$=−4.0 kOe, $H_{cr}$=3.13 kOe, $M_rt$=0.39 emu/cm$^2$. The Y-axis in decibels— relative to a one-milliwatt reference. The X-axis in kilo flux changes per inch.

The chart shows that the DC noise (curve 82) is close to the electronic noise floor (curve 80). This is a clear demonstration that the media has a negative nucleation field, $H_n$. The chart also shows that the media can be written. Both the signal from a pseudo-random bit sequence curve 84) and the signal from a high frequency AC signal (curve 86) have the necessary separation from DC and electronic noise at frequencies, <400 kfci.

Figure 9:
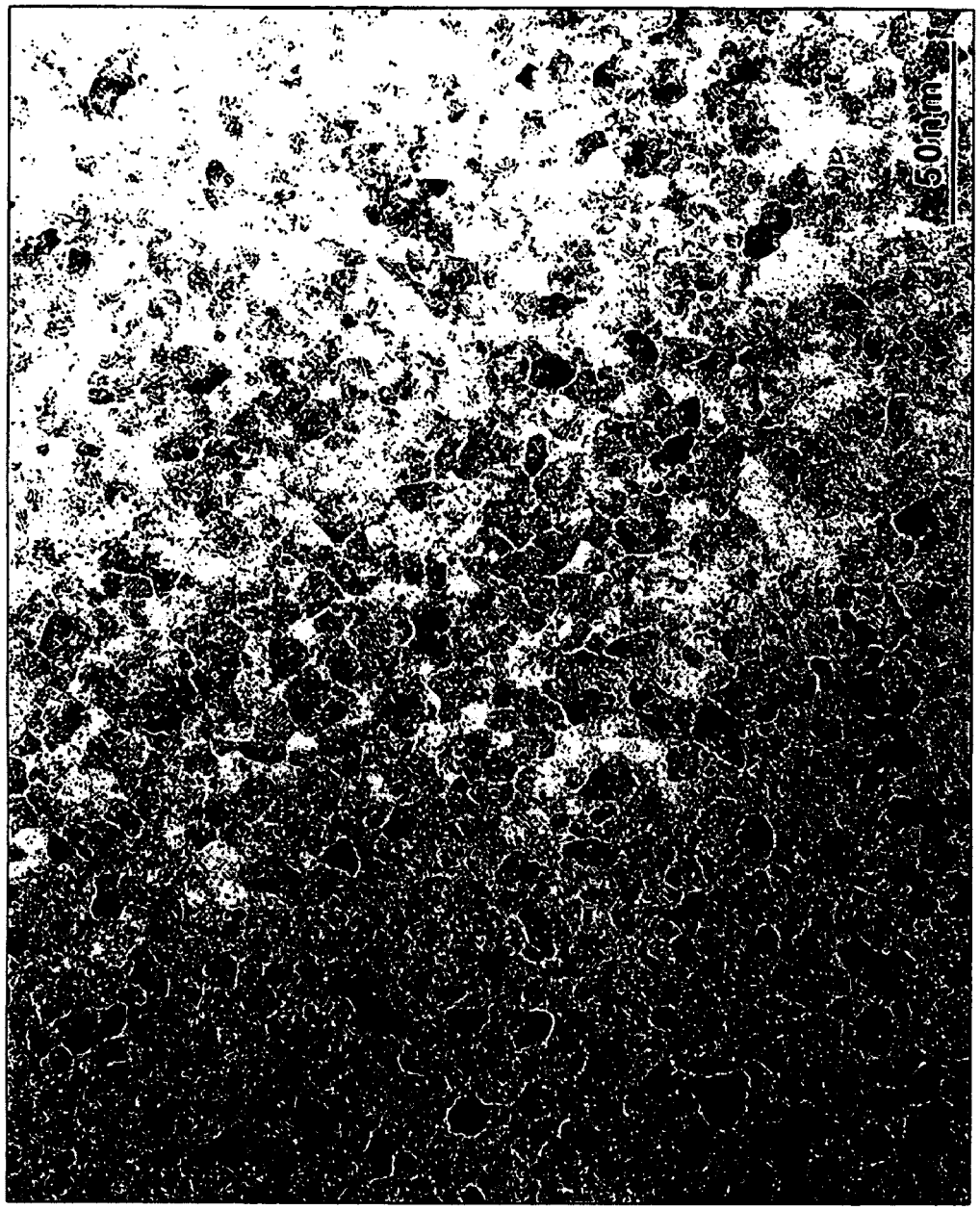
FIG. 9 is a TEM image of an exemplary chemically-ordered $(CoCr)_3Pt$ media.

FIG. 9 is a plan-view transmission electron microscopy (TEM) image of media with layers as follows: a soft underlayer of FeCoB (200 nm), an interlayer of $CoCr_{37}Ru_{10}$(1 nm)\Ru(3 nm), and a magnetic layer of$(Co_{0.75}Cr_{0.25})_3Pt$—B (10 nm). It shows a grain size and distribution of as 9.9±2.3 nm.

We have found the chemically order phase exists for the composition having the formula

where z ranges from 2.33 to 4.00, plus or minus 5%, and in particular for the composition having the formula

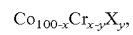

where x and y are atom % of the sub-composition, and where 00≦x≦35 and 0≦y≦5. The amount of the chemically or phase that exists in the final composition depends upon sputtering temperature. The amount of the ordered phase present increases from a substrate temperature of 240° centigrade and appears to reach a maximum at 320° centigrade.

Chromium is added to lower the magnetization of the material and also to decouple the magnetic exchange interaction between the grains. Pure Co₃Pt's saturation magnetization, $M_s$, of 1100 emu/cm³ is too high for acceptable magnetic recording. In order to operate successfully without saturating magnetic read heads, the product of remnant magnetization $M_r$ and the thickness t, $M_r$t (or $M_s$t assuming full squareness, $S=M_r/M_s=1$), should be in the range of 0.2–0.8 memu/cm². At a normal media thickness of ten nanometers (10 nm), this requires Ms be between 200–800 emu/cm3.

Further, without some kind of magnetic separation between grains, they will magnetically interact through exchange interaction. For example, one hundred grains will act as one, making it hard to control bit size.

When present in the alloy, chromium migrates to the grain boundaries and physically separates one grain from another. Chromium is non magnetic. The presence of this non-magnetic material between grains prevents their magnetic exchange interaction. This magnetically decouples one grain from another so that they can switch their magnetization independently.

As above described, the presence of chromium in the range of 15 to 25% is sufficient to reduce magnetic moment and provides grain decoupling to a certain extent. The amount of chromium used in a specific media will depend on the application.

The addition of the additive X in the basic alloy further reduces the solubility of chromium in the chemically ordered crystal structure. This then assists in chromium migrating to the grain boundaries to further enhance grain decoupling. As well, X itself migrates to the grain boundary and assists in magnetically separating the respective grains. The presence of additive X also affects the magnetic moment of the alloy. This permits the media designer to provide higher grain decoupling with less chromium. This in turn permits independent control of magnetic moments, coercivity and thermal stability, while still maintaining grain magnetic separation.

We have found that the X constituent may be selected from a group consisting of Sc, Ti, V, Cr, Mn, Ni, Cu, Zn, Ga, Ge, Nb, Mo, Ru, Rh, Pd, Ag, Cd, In, Sn, Hf, Ta, W, Re, Os, B, C, or any combination thereof. X's percentage in the alloy may range up to 5%.

These constituents may be co-sputtered with or without the additive Y to further enhance control of the magnetic properties, grain distribution and segregation of the resulting alloy.

The description of the particular alloy constituents and ranges should not be taken as a limitation on the scope of the appended claims. While the invention has been described in connection with perpendicular recording media, it may also be used in connection with longitudinal recording media. Those of ordinary skill may vary the additives and percentages of the constituents for specific applications as required by the specific application.

We claim:

1. A magnetic recording layer consisting of hexagonal chemically ordered polycrystalline $(CoX)_z Pt$ phase alloy, wherein z ranges from 2.33 to 4.00, ±5%, and where X is selected from a group consisting of Sc, Ti, V, Cr, Mn, Ni, Cu, Zn, Ga, Ge, Nb, Mo, Ru, Rh, Pd, Ag, Cd, In, Sn, Hf, Ta, W, Re, Os, B, and C, or any combination thereof.

2. The magnetic recording layer of claim 1 wherein Pt constitutes (25±5) atom % of the alloy, and CoX constitutes (75±5) atom % of the alloy; and further wherein Co constitutes from 65 atom % to 100 atom % and X ranges from greater than 0 atom % to 35 atom % of the CoX constituent of the alloy.

3. The magnetic recoding layer of claim 1 wherein the alloy is $(CoCrX)_z Pt$.

4. The recording layer of claim 3 wherein Pt constitutes (25±5)% of the alloy and CoCrX constitutes (75±5)% of the alloy, and CoCrX has the formula $$Co_{100-x}Cr_{x-y}X_y$$

where x and y are atom % of the sub composition, and where $0 \leq x \leq 35$ and $$0 \leq y \leq 5.$$

5. A magnetic recording medium having a magnetic layer comprising a hexagonal chemically ordered, polycrystalline phase alloy selected from the group consisting of $(CoCrB)_3 Pt$, $(CoCrC)_3 Pt$, $(CoCrZr)_3 Pt$, $(CoCrHf)_3 Pt$ and $(CoCrBCZrHf)_3 Pt$.

6. A magnetic recording layer according to claim 1 further comprising an additive Y, where Y is selected from the group consisting of B, MgO, Al₂O₃, SiO₂, P, CaO, CoO, B₂O₃, ZnO, NbO, Mo₂O₃, Co₂O₃, C, Cr, P, TiO₂, Cr₂O₃, MnO, ZrO₂, and BaO, and where Y can be up to 20 atom % of the total composition.

7. A magnetic recording layer according to claim 2 further comprising an additive Y, where V is selected from the group consisting of B, MgO, Al₂O₃, SiO₂, P, CaO,CoO, B₂O₃, ZnO, NbO, Mo₂O₃, Co₂O₃, C, Cr, P, TiO₂, Cr₂O₃, MnO, ZrO₂, and BaO, and where Y can be up to 20 atom % of the total composition.

8. A magnetic recording layer according to claim 4 further comprising an additive Y, where V is selected from the group consisting of B, MgO, Al₂O₃, SiO₂, P, CaO, CoO, B₂O₃, ZnO, NbO, Mo₂O₃, Co₂O₃, C, Cr, P, TiO₂, Cr₂O₃, MnO, ZrO₂, and BaO, and where V can be up to 20 atom % of the total composition.

9. A magnetic recording medium comprising:
   a substrate;
   an interlayer composed of one or more layers, at least one layer having a non-magnetic alloy with an hcp structure; and
   a magnetic recording layer consisting of hexagonal chemically ordered, polycrystalline $(CoX)_z Pt$ phase alloy, wherein z ranges from 2.33 to 4.00, ±5%, and where X is selected from a group consisting of Sc, Ti, V, Cr, Mn, Ni, Cu, Zn, Ga, Ge, Nb, Mo, Ru, Rh, Pd, Ag, Cd, In, Sn, Hf, Ta, W, Re, Os, B, and C, or any combination thereof.

10. A magnetic recording medium according to claim 9, wherein Pt constitutes (25±5)% of the alloy and CoX constitutes (75±5)% of the composition, and CoX has the formula $$Co_{100-x}Cr_{x-y}X_y$$

where x and y are atom % of the sub composition, and where $0 \leq x \leq 35$ and $0 \leq y \leq 5$.

11. A magnetic recording medium according to claim 9, further comprising:
   an additive Y, where Y is selected from the group consisting of B, MgO, Al₂O₃, SiO₂, P, CaO, CoO, B₂O₃, ZnO, NbO, Mo₂O₃, Co₂O₃, C, Cr, P, TiO₂, Cr₂O₃, MnO, ZrO₂, and BaO, and where Y can be up to 20% of the total composition.

* * * * *

UNITED STATES PATENT AND TRADEMARK OFFICE
CERTIFICATE OF CORRECTION

PATENT NO. : 7,186,471 B2 Page 1 of 1
APPLICATION NO. : 10/374641
DATED : March 6, 2007
INVENTOR(S) : Bin Lu and Dieter Weller It is certified that error appears in the above-identified patent and that said Letters Patent is hereby corrected as shown below:

On the Title Page Item (57)
Abstract
"$(COX)_3Pt$ or $(COX)_3PtY$ alloys." should read --$(CoX)_3Pt$ or $(CoX)_3PtY$ alloys.--

Column 6, Line 53
"$(COX)_zPt$," should read --$(CoX)_zPt$,--

Column 6, Line 60
"chemically or" should read --chemically ordered--

Column 8, Line 32 (Claim 8)
"where V" should read --where Y--

Column 8, Line 64 (Claim 11)
" up to 20%" should read --up to 20 atom percent--

Signed and Sealed this

Twentieth Day of November, 2007

JON W. DUDAS
*Director of the United States Patent and Trademark Office*